United States Patent
Hardy et al.

(10) Patent No.: US 10,283,597 B2
(45) Date of Patent: May 7, 2019

(54) SCANDIUM-CONTAINING III-N ETCH-STOP LAYERS FOR SELECTIVE ETCHING OF III-NITRIDES AND RELATED MATERIALS

(71) Applicant: The United States of America, as represented by the Secretary of the Navy, Washington, DC (US)

(72) Inventors: Matthew T. Hardy, Arlington, VA (US); Brian P. Downey, Alexandria, VA (US); David J. Meyer, Fairfax, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/807,821

(22) Filed: Nov. 9, 2017

(65) Prior Publication Data

US 2018/0130883 A1    May 10, 2018

Related U.S. Application Data

(60) Provisional application No. 62/420,029, filed on Nov. 10, 2016.

(51) Int. Cl.
*H01L 21/02* (2006.01)
*H01L 29/20* (2006.01)
(Continued)

(52) U.S. Cl.
CPC ...... *H01L 29/2003* (2013.01); *H01L 21/0254* (2013.01); *H01L 21/02378* (2013.01);
(Continued)

(58) Field of Classification Search
CPC ............. H01L 29/2003; H01L 21/3065; H01L 29/201
See application file for complete search history.

(56) References Cited

U.S. PATENT DOCUMENTS 8,901,708 B2 * 12/2014 Hashim ................. C23C 16/405
257/303
9,147,726 B2 * 9/2015 Thapa ............... H01L 21/02609
(Continued)

FOREIGN PATENT DOCUMENTS

WO    2010013821 A1    4/2010

OTHER PUBLICATIONS

Tsui, "Characterisation of scandium-based III-nitride thin films," Department of Materials, Imperial College London, Thesis, Doctor of Philosophy, Mar. 2016.*
(Continued)

*Primary Examiner* — Ismail A Muse
*Assistant Examiner* — Charles N Ausar-El
(74) *Attorney, Agent, or Firm* — US Naval Research Laboratory; Joslyn Barritt

(57) ABSTRACT

A semiconductor device structure including a scandium (Sc)- or yttrium (Y)-containing material layer situated between a substrate and one or more overlying layers. The Sc- or Y-containing material layer serves as an etch-stop during fabrication of one or more devices from overlying layers situated above the Sc- or Y-containing material layer. The Sc- or Y-containing material layer can be grown within an epitaxial group III-nitride device structure for applications such as electronics, optoelectronics, and acoustoelectronics, and can improve the etch-depth accuracy, reproducibility and uniformity.

10 Claims, 7 Drawing Sheets

(51) Int. Cl.
  *H01L 21/308* (2006.01)
  *H01L 29/201* (2006.01)
  *H01L 21/3065* (2006.01)
(52) U.S. Cl.
  CPC .. *H01L 21/02439* (2013.01); *H01L 21/02458* (2013.01); *H01L 21/02502* (2013.01); *H01L 21/3065* (2013.01); *H01L 21/3081* (2013.01); *H01L 29/201* (2013.01)

(56) References Cited

U.S. PATENT DOCUMENTS

| | | | |
|---|---|---|---|
| 10,217,930 B1* | 2/2019 | Feldman | H01L 41/29 |
| 2009/0029555 A1 | 1/2009 | Oh et al. | |
| 2012/0061683 A1 | 3/2012 | Toba et al. | |
| 2013/0084441 A1 | 4/2013 | Huang et al. | |
| 2013/0279102 A1* | 10/2013 | Brain | G06F 1/184 361/679.02 |
| 2015/0021624 A1 | 1/2015 | Meyer et al. | |
| 2015/0140710 A1 | 5/2015 | McLaurin et al. | |
| 2017/0198410 A1* | 7/2017 | Fenwick | C30B 25/183 |
| 2017/0213732 A1* | 7/2017 | Pierreux | H01L 21/0332 |
| 2017/0294529 A1* | 10/2017 | Beam, III | H01L 29/2003 |
| 2017/0338101 A1* | 11/2017 | Ueta | H01L 21/0237 |
| 2018/0138303 A1* | 5/2018 | Coffie | H01L 29/201 |
| 2019/0036592 A1* | 1/2019 | Shealy | H04B 7/0814 |

OTHER PUBLICATIONS

Moram et. al., "Structural properties of wurzitelike ScGaN films grown by NH3-molecular beam epitaxy," Journal of Applied Physics 106 113533 (2009).*
Hardy ey. al., "Epitaxial ScAlN etch stop Layers Grown by Molecular Beam Epitaxy for Selective Etching of AlN and GaN," IEEE Transactions on Semiconductor Manufacturing, vol. 30, No. 4, Nov. 2017.*
Lee et. al., "Bendable GaN high electron mobility transistors on plastic substrates," Journal of Applied Physics 100, 124507 (2006) ("Lee").*
Henry et. al., "ScAlN etch mask for highly selective silicon etching", J. Vac. Sci. Technol. B 35(5), Sep./Oct. 2017 (Year: 2017).*
Search Report and Written Opinion dated Feb. 27, 2018 in corresponding International Application No. PCT/US17/60771.
D. Buttari, et al., "Selective Dry Etching of GaN Over AlGaN in BCl3/SF6 Mixtures," International Journal of High Speed Electronics and Systems, vol. 14, pp. 756 761, 2004.
J. M. Lee, et al., "Highly selective dry etching of III nitrides using an inductively coupled Cl2/Ar/O2 plasma," J. Vac. Sci. Technol., B, vol. 18, pp. 1409 1411, 2000.
G. H. Rinehart et al., "Vapor Pressure and Vaporization Thermodynamics of Scandium Trifluoride," J. Less Common Met., vol. 75, pp. 65 78, 1980.
C. L. Yaws, The Yaws Handbook of Vapor Pressure: Antoine coefficients, 2nd ed. Waltham, MA, USA: Gulf Professional Publishing, 2015, pp. 316-320.
S. J. Pearton, et al., "A Review of Dry Etching of GaN and Related Materials," MRS Internet J. Nitride Semicond. Res., 5, 11, pp. 1-38 (2000).
G. Piazza, et al., "Piezoelectric aluminum nitride thin films for microelectromechanical systems," MRS Bulletin, vol. 37, pp. 1051 1061, Nov. 2012.
M. Akiyama, et al., "Enhancement of Piezoelectric Response in Scandium Aluminum Nitride Alloy Thin Films Prepared by Dual Reactive Cosputtering," Adv. Mater., vol. 21, pp. 593 596, 2009.
M. A. Moram, et al., "The effect of oxygen incorporation in sputtered scandium nitride films," Thin Solid Films, vol. 516, pp. 8569 8572, 2008.
S. M. Knoll, et al., "Defects in epitaxial ScGaN: Dislocations, stacking faults, and cubic inclusions," Appl. Phys. Lett. 104, 101906 (2014).
M. T. Hardy, et al., "Epitaxial ScAlN grown by molecular beam epitaxy on GaN and SiC substrates," App. Phys. Lett. 110, 162104 (2017).
M. A. Moram et al., "ScGaN and ScAlN: emerging nitride materials," J. Mater. Chem. A, vol. 2, pp. 6042 6050, 2014.
S. Sergent, et al., "High Q AlN photonic crystal nanobeam cavities fabricated by layer transfer," Appl. Phys. Lett., vol. 101, p. 101106, 2012.
S. Zhang et al., "Tunable optoelectronic and ferroelectric properties in Sc based III nitrides," J. Appl. Phys. 114, 133510 (2013).
A. Konno et al., "Thin Film from Bulk and Leaky Lamb Waves in MEMS-based Samples," 2014 IEEE International Ultrasonics Symposium Proceedings, pp. 273-276.
N. Sedrine et al., "Bandgap Engineering and Optical Constants of YxAl1-xN Alloys," Japanese Journal of Applied Physics 52 (2013) 08JM02.

* cited by examiner

SCANDIUM-CONTAINING III-N ETCH-STOP LAYERS FOR SELECTIVE ETCHING OF III-NITRIDES AND RELATED MATERIALS

CROSS-REFERENCE

This Application is a Nonprovisional of and claims the benefit of priority under 35 U.S.C. § 119 based on U.S. Provisional Patent Application No. 62/420,029 filed on Nov. 10, 2016. The Provisional application and all references cited herein are hereby incorporated by reference into the present disclosure in their entirety.

TECHNICAL FIELD

The present invention relates to etching of III-nitride semiconductor materials, particularly to etching of III-nitride semiconductor materials with respect to a scandium (Sc)- or yttrium (Y)-containing etch-stop layer.

BACKGROUND

Numerous methods have been developed for controlling the etch depth of the various constituent material layers during the fabrication of microelectronic devices, optoelectronic devices such as light-emitting and laser diodes, and micro-electro-mechanical systems. In order to etch a material down to a given depth, the etch can be terminated after a pre-determined amount of time using a calibrated etch rate.

However, run-to-run variation in the etch rate, layer thicknesses, and etch chamber uniformity can make it very difficult to consistently etch to a specified depth or vertical position in the layer structure over a full wafer.

Wet chemical etching many III-nitride materials is difficult due to very slow etch rates or the need for electrodes and illumination as in photoelectrochemical (PEC) etching. Dry etching processes, such as reactive ion etching (RIE) and inductively coupled plasma (ICP) RIE, are preferred for many applications over wet chemical etching because they can produce vertical sidewall structures and etch quickly through a wide variety of materials.

Selective etching makes use of varying etch rates among different materials, and is used in conjunction with a low-etch-rate etch-stop layer to greatly increase the process window, which results in a highly repeatable etch depth. An etch-stop layer having high etch selectivity with respect to material layers of AlN or high-Al-fraction AlGaN and InAlN is desirable to improve process control and reproducibility in ultra-wide-bandgap electronics, acoustoelectric devices, and UV optoelectronics. A candidate etch-stop layer should have high selectivity across a range of process conditions so that the dry etch process can be optimized to improve etch rate and anisotropy without sacrificing selectivity. No current etch-stop layer material fulfills these requirements for AlN or high Al-fraction AlGaN and InAlN.

Selective dry etching of GaN using an aluminum (Al)-containing etch-stop layer such as $Al_xGa_{1-x}N$ or AlN is possible with $BCl_3/SF_6$ or $Cl_2/O_2$ etch chemistries. See D. Buttari, et al., "Selective Dry Etching of GaN Over AlGaN in $BCl_3/SF_6$ Mixtures," *International Journal of High Speed Electronics and Systems*, vol. 14, pp. 756-761, 2004; and J.-M. Lee, et al., "Highly selective dry etching of III nitrides using an inductively coupled $Cl_2/Ar/O_2$ plasma," *J. Vac. Sci. Technol., B*, vol. 18, pp. 1409-1411, 2000. However, the etch byproducts have very low vapor pressure at the etch temperature (e.g. $<10^{-26}$ Torr for $AlF_3$) relative to the process pressure ($\sim 10^{-3}$ Torr), causing the etch byproducts to remain on the etch-stop layer surface and prevent further reaction from occurring.

The plots in FIG. 1 show the partial pressures of common RIE reaction byproducts at various temperatures for III-nitride materials. See G. H. Rinehart et al., "Vapor-Pressure And Vaporization Thermodynamics Of Scandium Trifluoride," *J. Less Common Met.*, vol. 75, pp. 65-78, 1980; and C. L. Yaws, *The Yaws Handbook of Vapor Pressure: Antoine coefficients*, $2^{nd}$ ed. Waltham, Mass., USA: Gulf Professional Publishing, 2015, pp. 316-320. Indium Chloride ($InCl_3$) (shown by plotline 107 in FIG. 1) is the dominant reaction product in RIE processes, see S. J. Pearton, et al., "A Review of Dry Etching of GaN and Related Materials," *MRS Internet J. Nitride Semicond. Res.*, 5, 11, pp. 1-38 (2000), and as shown in FIG. 1, has a fairly low partial pressure.

While physical bombardment with heavy ions can remove some fraction of the adsorbed species, the resulting etch rate is much slower for the AlN or AlGaN etch-stop layer than GaN. Oxygen ($O_2$) chemistries can lead to micromasking due to the formation of non-volatile $SiO_x$ via reaction with Si in the etch chamber or carrier wafer, while $SF_6$ chemistries tend to lead to pitting for higher $SF_6$ concentrations. See Lee, supra.

With some limitations, these etch chemistries can enable selective etching of GaN with respect to an Al-containing etch-stop layer, but cannot selectively etch a high Al fraction $Al_xGa_{1-x}N$ or AlN layer.

Given the high vapor pressure of $AlCl_3$ (plotline 103) and $GaCl_3$ (plotline 105), Sc-containing etch-stop layers are effective with respect to $Al_xGa_{1-x}N$ of any composition, including AlN due to the low vapor pressures of the expected etch byproducts such as $ScCl_3$ (plotline 101) and $ScF_3$ (plotline 102) of Sc-containing layers such as ScAlN and ScGaN.

However, Sc-containing etch byproducts such as $ScCl_3$ (plotline 101) and $ScF_3$ (plotline 102) have partial pressures many orders of magnitude lower than InCl (plotline 106) and $InCl_3$ (plotline 107), suggesting they will be more difficult to remove from the sample surface, leading to a more robust and larger reduction of the etch rate with use of a Sc-containing etch-stop layer such as ScAlN and ScGaN.

Historically, the primary deposition technique for ScAlN has been reactive sputtering. Highly c-axis oriented films with thicknesses of 1 μm have been demonstrated having a piezoelectric response up to five times higher than sputtered AlN. See G. Piazza, et al., "Piezoelectric aluminum nitride thin films for microelectromechanical systems," *MRS Bulletin*, vol. 37, pp. 1051-1061, 11 2012; see also M. Akiyama, et al., "Enhancement of Piezoelectric Response in Scandium Aluminum Nitride Alloy Thin Films Prepared by Dual Reactive Cosputtering," *Adv. Mater.*, vol. 21, pp. 593-596, 2009.

However, incorporation of impurities, particularly oxygen, can degrade the quality of ScAlN. See M. A. Moram, et al., "The effect of oxygen incorporation in sputtered scandium nitride films," *Thin Solid Films*, vol. 516, pp. 8569-8572, 2008 ("Moram 2008"). Growth of ScAlN by molecular beam epitaxy (MBE) on high quality hexagonal substrates has the potential for improved crystal quality and greatly reduced impurity incorporation suitable for high performance electronic, optoelectronic, and acoustoelectric devices. In addition, growth of ScGaN by MBE has recently been demonstrated. See S. M. Knoll, et al., "Defects in epitaxial ScGaN: Dislocations, stacking faults, and cubic inclusions," *Appl. Phys. Lett.* 104, 101906 (2014).

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a structure and method for selectively dry etching any combination of III-nitride semiconductor materials using a scandium (Sc)-containing etch-stop layer.

In accordance with the present invention, a Sc-containing layer can be incorporated into a semiconductor device structure, wherein the Sc-containing layer serves as an etch-stop during fabrication of one or more devices from overlying layers situated above the Sc-containing layer.

In an exemplary embodiment, a semiconductor device structure in accordance with the present invention includes a substrate, a Sc-containing etch-stop layer situated on top of the substrate, and one or more overlying III-nitride layers formed on an upper surface of the Sc-containing etch-stop layer. The structure may also optionally include one or more intermediate epitaxial layers situated between the substrate and the Sc-containing etch-stop layer.

When etching is performed on the structure, e.g., by dry etching the overlying epitaxial layers and other device layers using chlorine-based reactive ion etching (RIE) or inductively coupled plasma (ICP) RIE, the presence of the Sc in the etch-stop layer causes a large decrease in the etch rate relative to the rate experienced in non-Sc-containing overlying III-nitride layers. The low etch rate in the etch-stop layer allows the dry etch to proceed quickly through the III-nitride layers, and then very slowly in the etch-stop layer, effectively stopping the etch at a predetermined location (defined by epitaxial layer structure design and growth) within the device structure.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a semiconductor device structure that includes a scandium (Sc)-containing etch-stop layer and one or more III-nitride overlying semiconductor device layers and further includes a method for dry etching the III-nitride semiconductor device layers using the Sc-containing etch-stop layer.

Figure 1:
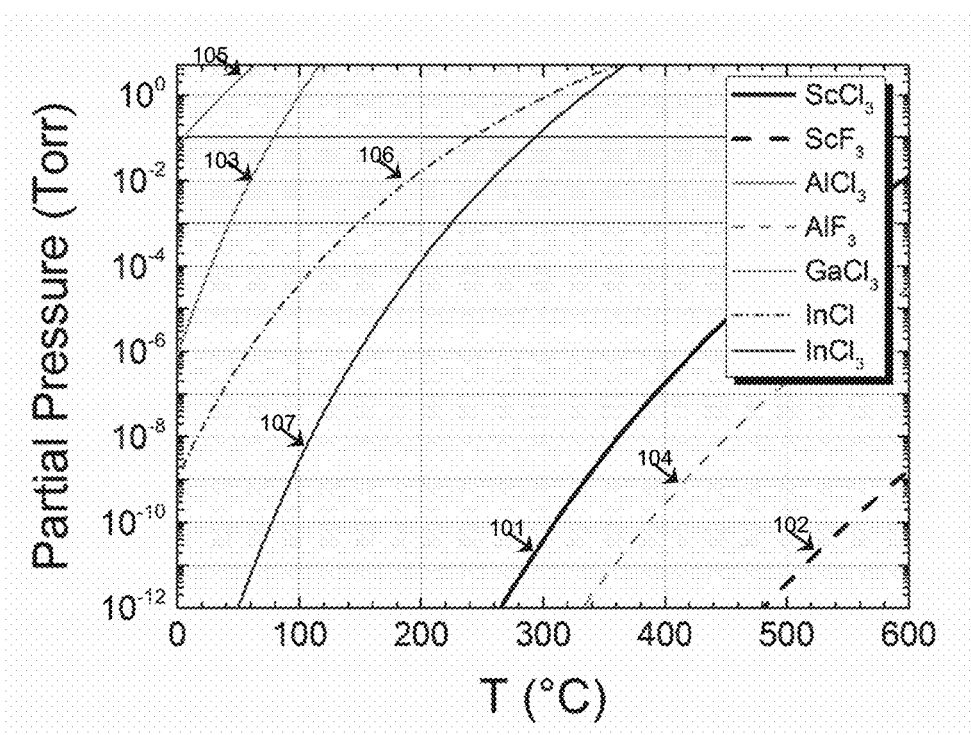
FIG. 1 is a plot depicting the partial pressures of common reactive-ion etch (RIE) reaction byproducts at various temperatures.

The plots in FIG. 1 show the vapor pressure of various Sc-based and Group III-based materials at various temperatures.

As shown in FIG. 1, the vapor pressure of $ScCl_3$ and $ScF_3$, shown by plotlines 101 and 102, is very low, even at elevated temperatures, whereas $AlCl_3$, shown by plotline 103, has a high vapor pressure, even at low temperatures. As a result of its high vapor pressure, $AlCl_3$ will evaporate very quickly in an etch environment, making it unsuitable for use as an etch-stop layer in many cases. In contrast, because of their low vapor pressure, the Sc-containing materials evaporate very slowly in an etch environment, and so can be used as good etch-stop layers in many applications.

As only a small percentage of scandium is needed in a Sc-containing material to make it a good etch-stop layer, a large range of Sc stoichiometries can be used in the etch-stop layer, allowing the in-plane lattice constant to be tailored to closely or exactly match other layers within the epitaxial heterostructure. For example, wurtzite-structure ScAlN and ScGaN can be grown epitaxially on GaN and AlN as well as on common substrates used for III-nitride materials, such as SiC, and because they produce only a slight mismatch in the lattice, such Sc-containing materials can be incorporated into or near the active region of devices without creating additional defects which may degrade the device quality. See M. T. Hardy, et al., "Epitaxial ScAlN grown by molecular beam epitaxy on GaN and SiC substrates," *App. Phys. Lett.* 110, 162104 (2017); and M. A. Moram et al., "ScGaN and ScAlN: emerging nitride materials," *J. Mater. Chem. A*, vol. 2, pp. 6042-6050, 2014 ("Moram 2014"); see also Piazza, supra.

Thus, as described in more detail below, a semiconductor device structure in accordance with the present invention can include a Sc-containing etch-stop layer disposed between a substrate and one or more overlying layers, with one or more intermediate epitaxial layers optionally being grown between the substrate and the etch-stop layer, where the Sc-containing etch-stop layer allows the overlying layers to be controllably and uniformly etched to a desired depth without damage to any underlying intermediate epitaxial layer or substrate, which may be critical to device performance. In many embodiments, the Sc-containing etch-stop layer can be epitaxially grown on the substrate or, where present, on an upper surface of the topmost intermediate epitaxial layer. In many embodiments, the overlying device layers can be epitaxially grown on an upper surface of the Sc-containing etch-stop layer. The large range of scandium alloy fractions available to make a good etch-stop layer allows such epitaxial growth to occur without any significant distortion in the crystal lattice, eliminating the creation of any additional defects in the above material. For many electronic and optoelectronic applications, the formation of defects within the material heterostructure, such as dislocations and grain boundaries, can produce significant degradation in the electrical and/or optical performance of the device. The ability to grow a single crystal heterostructure using a Sc-containing etch-stop layer, such as ScAlN or ScGaN, maximizes device performance.

Figure 2:
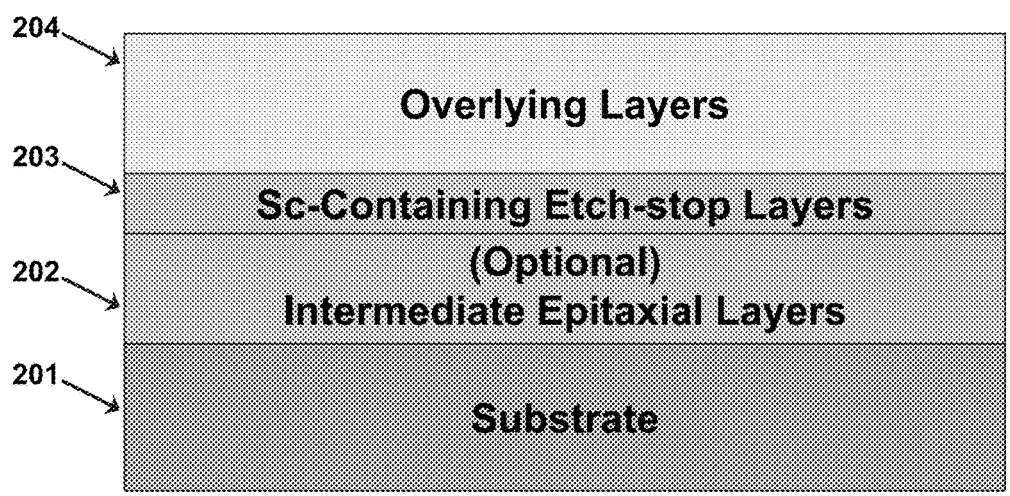
FIG. 2 is a block schematic illustrating aspects of an exemplary embodiment of a heterostructure including a Sc-containing etch-stop layer in accordance with the present invention.

The block schematic in FIG. 2 illustrates aspects of an exemplary embodiment of a semiconductor device structure that includes a Sc-containing etch-stop layer. As illustrated in FIG. 2, such a device structure includes a substrate 201, one or more optional intermediate epitaxial layers 202 on an upper surface of the substrate, one or more Sc-containing etch-stop layers 203 embedded within or below overlying device layers 204.

Optional intermediate epitaxial layers 202 can comprise any suitable material such as group III or transition metal nitride materials including AlN, GaN, InN, BN, ScN, NbN$_x$, TaN$_x$ and their ternary and quaternary compounds and in some embodiments can include buffer layers, device active layers, or sacrificial layers. Overlying layers 204 can also include buffer layers, device layers, or sacrificial layers and can be made from any suitable material and/or material structure, including metals such as Nb$_2$N or Ta$_2$N, amorphous materials such as silicon dioxide or silicon nitride, or epitaxially grown single-crystal or polycrystalline III-nitride semiconductor materials as listed above. In many embodiments, the overlying layers will include at least one single-crystal AlN, AlGaN, or GaN layer, and as described herein the presence of the Sc-containing etch-stop layer in accordance with the present invention enables such materials to be controllably and uniformly etched to a pre-determined depth without damage to the underlying intermediate epitaxial layers or substrate. No previous etch-stop layer other than that provided by the present invention is capable of being used with such AlGaN or AlN layers.

In an exemplary embodiment, a semiconductor device structure in accordance with the present invention includes an epitaxial heterostructure having a Sc$_x$Al$_{1-x}$N etch-stop layer 203 underlying one or more overlying layers 204 that are to be dry etched, where the etch-stop layer is grown either directly on the substrate or on an upper surface of the optional intermediate epitaxial layers. As noted above, the need for only a small percentage of scandium in the Sc-containing etch-stop layer allows for a large range of acceptable Sc-concentrations, making it possible to tailor the in-plane lattice constant and epitaxially grow the etch-stop layer and to epitaxially grow the overlying layers on the etch-stop layer so that the entire structure is grown as a continuous single-crystal structure.

The ScAlN layer can be grown by any suitable technique, though in many cases, epitaxial growth by means of MBE will be desirable because of the high crystalline quality epitaxial material it produces. As the in-plane lattice constant of the ScAlN can be tailored while still acting as an etch-stop layer, the ScAlN grown to suitable thickness to allow for tolerances in the etching process and thickness control in the overlying layer growth process. A sufficient thickness of etch-stop layer is needed to allow for over-etching of the overlaying layers to ensure that the overlying layers are completely etched. The etch-stop thickness will then scale with overlying thickness and etch selectivity.

In an exemplary case, the ScAlN layer can be grown through an MBE process that includes use of an electron beam (e-beam) evaporator to provide Sc and an effusion cell to provide Al, and an RF plasma source with supplied ultra-high purity N$_2$ to provide active nitrogen (N*), with the e-beam source being typically operated at 9 kV with emission currents of 20-100 mA. In other cases, the Sc could be supplied using an effusion cell. In both cases, N* fluxes can be in the range 0.1-200 nm/min Ga-excess GaN-equivalent growth rate, with preferred N* fluxes in the range 1-10 nm/min. The combined Sc and Al fluxes should be less than the N* flux, such that the Sc to combined Sc and Al flux ratio is proportional to the desired Sc content in the film. The RF plasma source is typically operated at 200-500 W with an N$_2$ flow of 0.5-3 sccm. Such epitaxial ScAlN layers have been demonstrated on both N-face freestanding GaN and Si-face 4H-SiC substrates, see Hardy, supra, where the ScAlN films were grown with GaN equivalent growth rate fluxes of N*=4.3 nm/min, Al=2.58 nm/min, and nominal Sc=0.57 nm/min, and where the Sc compositions of the films were 0.16-0.20.

Figure 3A:
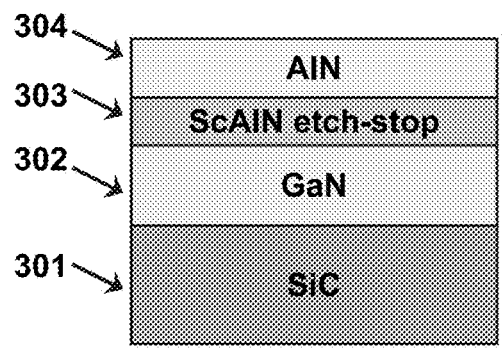
FIGS. 3A-3C are block schematics illustrating aspects of device etching in a heterostructure including a Sc-containing etch-stop layer in accordance with the present invention.
Figure 3B:
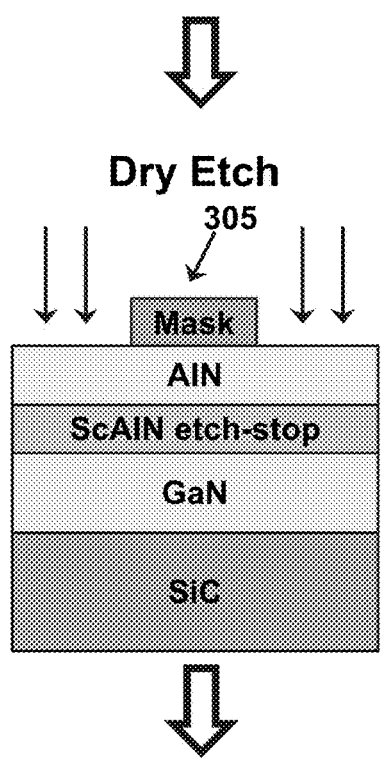
Figure 3C:
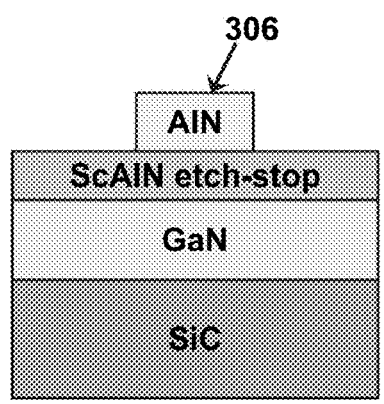

FIGS. 3A-3C illustrate aspects of an exemplary case of device etching using an Sc-containing etch-stop layer in accordance with the present invention. As illustrated in FIG. 3A and as described above, an epitaxially grown ScAlN etch-stop layer 303 is embedded in a semiconductor device heterostructure comprising a SiC substrate 301, a GaN layer 302 that has been epitaxially grown on an upper surface of the SiC substrate, and an AlN overlying layer 304 that has been epitaxially grown on an upper surface of the ScAlN etch-stop layer. As illustrated in FIGS. 3B and 3C, a dry etch can be applied to etch a portion 306 of the AlN layer defined by an etch mask 305, where the defined portion of the AlN layer can be used for fabrication of a semiconductor device such as a transistor, a light emitting diode, or acoustoelectric device. The ScAlN etch-stop layer allows for controllable etching to a precise depth with the device heterostructure without the need for precise timing, taking into account non-uniformities in the etching process and device layer thicknesses.

Figure 4A:
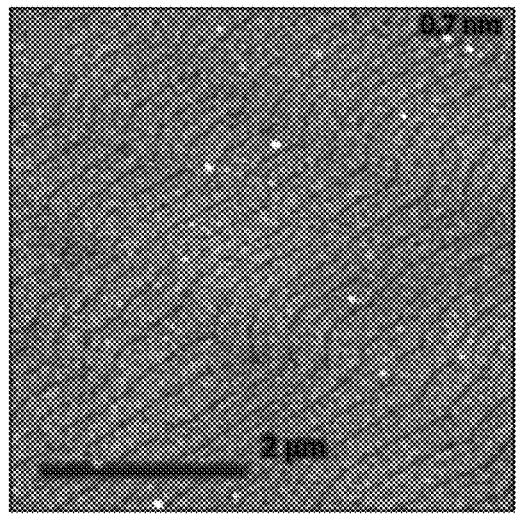
FIGS. 4A-4C illustrate aspects of an exemplary ScAlN layer grown on GaN in accordance with the present invention.
Figure 4B:
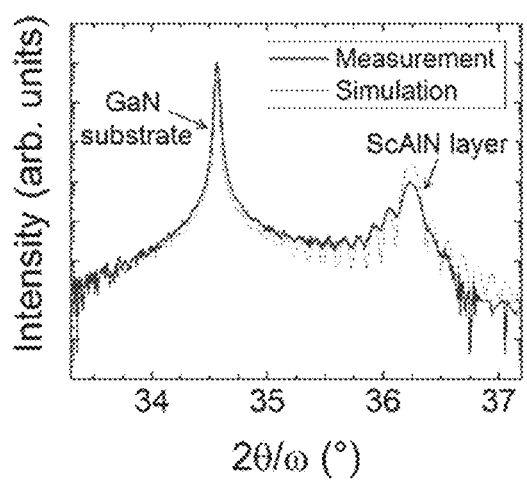
Figure 4C:
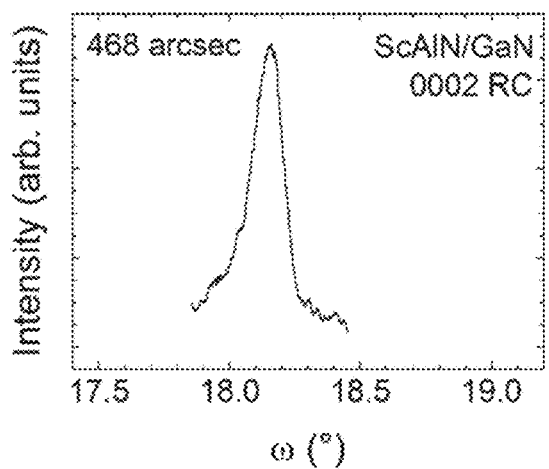

FIGS. 4A-4C illustrate the results of analysis of an exemplary ScAlN layer grown on GaN in accordance with one or more aspects of the present invention.

FIG. 4A is an atomic force micrograph (AFM) of a 73-nm-thick Sc$_{0.20}$Al$_{0.80}$N sample grown by MBE on N-polar GaN, which has an rms roughness of 0.70 nm and a Z-scale range of 0-10 nm, demonstrating the smooth surface that can be achieved for growth of overlying layers.

The plots in FIGS. 4B and 4C show the results of XRD characterization of the ScAlN sample depicted in FIG. 4A, where FIG. 4B shows the results of an XRD 0002 2θ/ω measurement showing the ScAlN layer peak and Pendellösung fringes and FIG. 4C shows the 0002 XRD rocking curve of the ScAlN layer with a FWHM of 468 arcsec, demonstrating that the ScAlN has only a single phase with high structural quality, which will permit high quality epitaxy of the growth of overlying layers.

Figure 5A:
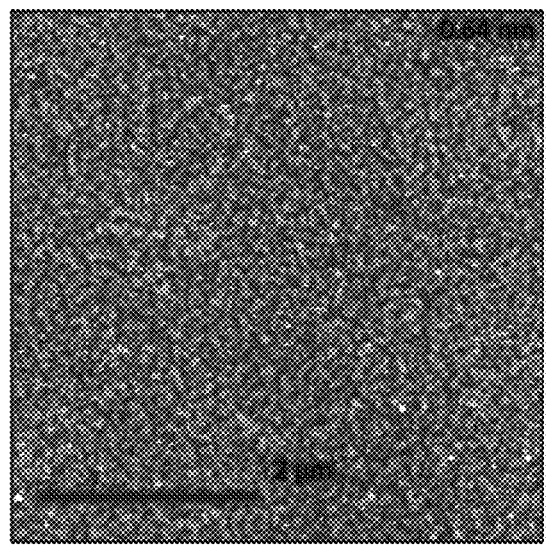
FIGS. 5A and 5B illustrate aspects of an exemplary ScAlN layer grown on SiC in accordance with the present invention.
Figure 5B:
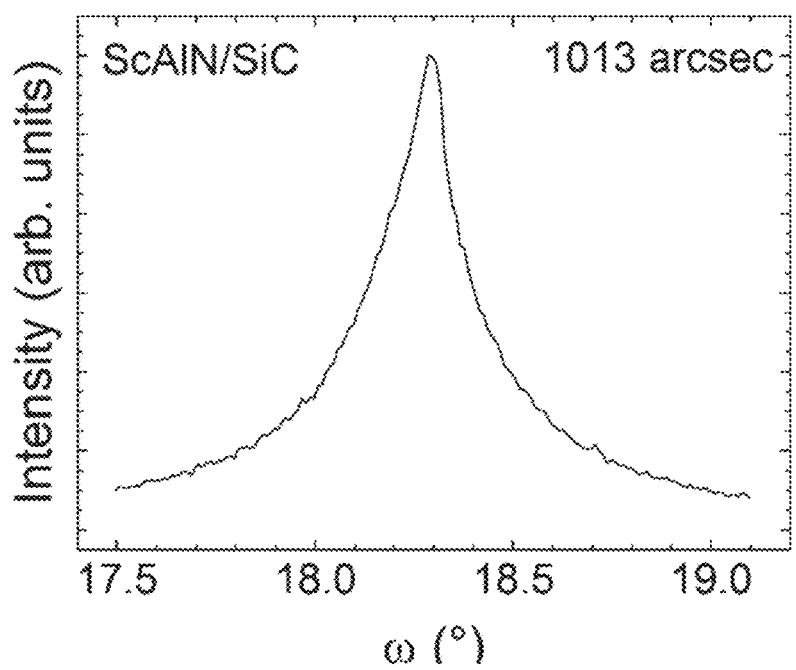

FIGS. 5A-5B illustrate the results of analysis of a 200-nm Sc$_{0.17}$Al$_{0.83}$N epitaxial layer grown directly on 4H-SiC without intermediate or buffer layers, where the ScAlN layer surface had an rms roughness of 0.64 nm and a 0002 rocking FWHM of 1013 arcsec in spite of the 3.7% lattice mismatch between Sc$_{0.17}$Al$_{0.83}$N and SiC, demonstrating that the ScAlN has smooth surface morphology and high structural quality, which will permit high quality epitaxy of the growth of overlying layers even without the use of a buffer layer.

EXAMPLE

In this example, a standard ICP-RIE process was been used to etch separate GaN, AlN, and $Sc_{0.16}Al_{0.84}N$ epitaxial thin films grown by MBE on SiC substrates. The standard dry etch process consisted of $Ar/BCl_3/Cl_2$ process gases flowing at 10/10/20 sccm at nominally 38° C. and 5 mTorr chamber pressure. The ICP and RIE powers were 200 W and 50 W, respectively. The etch process was designed to give uniform, repeatable etching and was not changed to modify the etch selectivity.

Etch rates measured using the standard etch process were 21.4 Å/s for GaN, 12.2 Å/s for AlN, and 2.2 Å/s for $Sc_{0.16}Al_{0.84}N$, giving etch selectivities of 10.7:1 for $GaN/Sc_{0.16}Al_{0.84}N$ and 5.5:1 for $AlN/Sc_{0.16}Al_{0.84}N$. The $Sc_{0.16}Al_{0.84}N$ layer acts as an etch-stop layer which can be used to selectively etch AlN or AlGaN. To improve selectivity, the etch conditions can be optimized to emphasize the chemical nature of the etch (increased ICP power, increased $Cl_2$ flow rate, higher chamber pressure) and reduce the physical components of the etch (reduced RIE power or DC bias, reduced Ar and $BCl_3$ flow rates), and/or the Sc content of the etch-stop layer can be increased.

The above example demonstrates that the ScAlN material has improved selectivity for etching GaN as compared to AlN, and that ScAlN can be utilized as an etch-stop layer for AlN or AlGaN using standard $Cl_2$-based chemistry.

Alternatives

In alternative embodiments, Sc-containing etch-stop layer in accordance with the present invention can be grown directly on a substrate such as AlN, GaN, SiC, sapphire, or other suitable material. In addition, the Sc-containing etch-stop layer can be not only ScAlN as described herein, but can also include other Sc-containing materials such as ScGaN, ScN, ScInN, or related quaternary alloys.

Other alternatives include additional methods of material growth. Although the inventors' reduction to practice of the present invention utilized material grown by molecular beam epitaxy, in principle many alternative growth techniques such as metalorganic chemical vapor deposition, atomic layer deposition, atomic layer epitaxy, sputtering, electron beam evaporation, pulsed laser deposition, etc., can be used to form the material layers in the semiconductor device structure in accordance with the present invention, including the Sc-containing etch-stop layer. If the overlying layers do not need to be high-quality single-crystal material, then the Sc-containing etch-stop layer does not necessarily need to be epitaxial or crystalline, so that in some embodiments, polycrystalline or amorphous material such as Sc metal, ScN, or Sc(Ga,Al,In)N can be used for the Sc-containing etch-stop layer, the use of which may potentially provide lower cost deposition and processing routes. In other embodiments, the Sc-containing etch-stop layer could also be used in conjunction with other material systems, such as cubic III-V, II-VI, or Group IV materials.

Other etch chemistries and/or methods can also be used, so long as the etch rate of the Sc-containing etch-stop layer is significantly lower than the etched layers. In addition, incorporation of Sc in the place of Ga for AlGaN (i.e. ScAlN) in an etch-stop layer should help improve the selectivity of conventional $BCl_3/SF_6$ selective etch processes. In this case, the vapor pressure of both $ScF_3$ and $ScCl_3$ are both very low, leading to robust etch impediment and low etch rates in the etch-stop layer. For AlGaN, only AlN impedes etching, while GaN is readily etched in $BCl_3/SF_6$ etch chemistries. See Buttari, supra; see also Pearton, supra.

In still other embodiments, one or more etch-stop layers of an yttrium-containing material such as epitaxial YAlN or epitaxial YGaN can be used with the same beneficial etch-stop functionalities described above with respect to Sc-containing layers. As with the Sc-containing compounds described above, the vapor pressure of yttrium-containing compounds also is low relative to Group III materials such as $AlCl_3$, $GaCl_3$, and InCl, so that they also can form a good etch-stop for Group III-nitride semiconductor materials. Such yttrium-containing etch-stop layers can be used either alone in a heterostructure as described herein, or can be used in addition to one or more Sc-containing layers.

The embodiments described above use the etch-stop layer in conjunction with top-down etching. In other embodiments, the use of an Sc-containing etch-stop layer in accordance with the present invention can facilitate a robust substrate removal process and allow etching of the substrate from the backside while preventing over-etching into the device layers; such a process can be used to remove an absorbing AlN substrate and improve the light extraction efficiency of deep UV light-emitting diodes.

Figure 6:
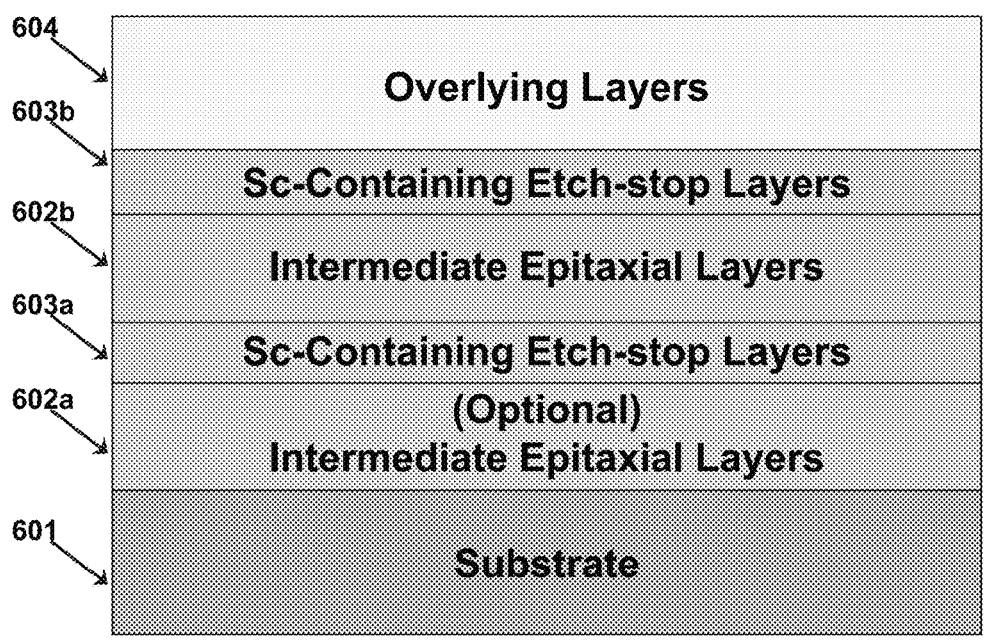
FIG. 6 is a block schematic illustrating aspects of another exemplary embodiment of a heterostructure including Sc-containing etch-stop layer in accordance with the present invention.
Figure 7:
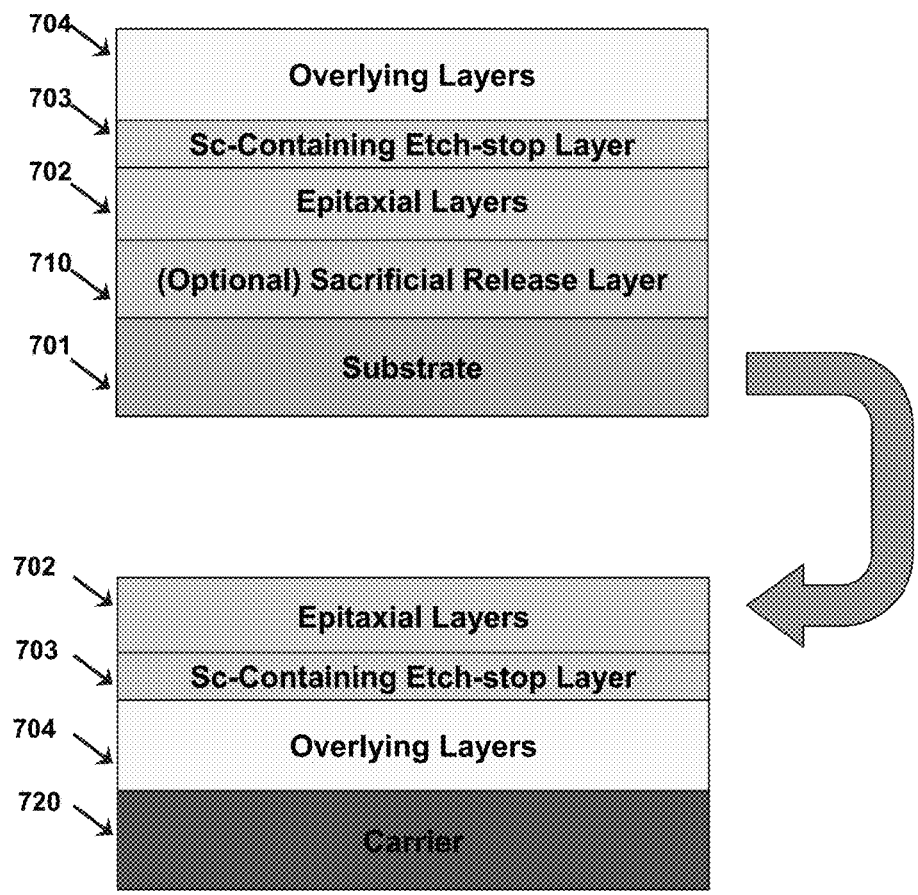
FIG. 7 is a block schematic illustrating aspects of another exemplary embodiment of a heterostructure including Sc-containing etch-stop layer in accordance with the present invention.

FIGS. 6 and 7 depict aspects of additional alternative embodiments of a semiconductor device structure for selective etching of III-nitride and related materials in accordance with one or more aspects of the present invention, in which the structure includes multiple or repeating Sc-containing etch-stop layers.

In a first alternative embodiment, aspects of which are illustrated by the block schematic shown in FIG. 6, a semiconductor device structure in accordance with the present invention can include one or more repeating series of alternating Sc-containing etch-stop layers 603a/603b and intermediate epitaxial layers 602a/602b. Such a structure can allow multiple dry etches at different stages of the process, using any suitable etching scheme such as a timed dry etch or a wet etch to etch through the upper Sc-containing etch-stop layer 603b prior to a second etch. This second etch would then proceed though the upper intermediate epitaxial layers 602b and use the lower Sc-containing etch-stop layer 603b to control the second etch depth. This method would work particularly well in cases where precise etching of two separate device layers is required to maximize device performance.

In addition, with the inclusion of a sacrificial release layer for epitaxial lift-off and transfer, see U.S. Patent Application Publication No. 2015/0021624, "Lift-off of epitaxial layers from silicon carbide or compound semiconductor substrates," or a substrate removal process, see S. Sergent, et al., "High-Q AlN photonic crystal nanobeam cavities fabricated by layer transfer," *Appl. Phys. Lett.*, vol. 101, p. 101106, 2012, an alternative implementation would involve placing the Sc-containing etch-stop layer 703 above the epitaxial layer 702 that will be etched, as shown in FIG. 7, which involves a so-called "flip chip" process using an etch-stop layer.

The overlying layers 704 can contain any combination of epitaxial and non-epitaxial layers. Following the transfer, the device structure can be flipped over and mounted to a carrier 720. The optional intermediate epitaxial layers 702 can then be etched in a top-down manner making use of the Sc-containing etch-stop layer 703. Such a process may be used, for example, to controllably remove a defective (AlN and/or AlN/GaN) buffer layer while protecting device layers (which are included in the overlaying layers 704 in this example).

In another alternative embodiment, the Sc-containing etch-stop layer comprises a high-fraction $Sc_xAl_{1-x}N$, with $x \geq 0.57$, in conjunction with cubic semiconductors, such as cubic (In,Ga,Al)N, having a lattice constant similar to that of the etch-stop layer. For $x \geq 0.57$, $Sc_xAl_{1-x}N$ is stable in a rock salt crystal structure and more compatible with cubic III-N materials, or other cubic materials. The higher Sc composition should also improve the selectivity with respect to $Al_xGa_{1-x}N$. See S. Zhang et al., "Tunable optoelectronic and ferroelectric properties in Sc-based III-nitrides," *J. Appl. Phys.* 114, 133510 (2013).

Advantages and New Features

The primary advantage of the current method is improved dry etch selectivity of a AlN or high Al-fraction AlGaN or InAlN layer with respect to existing epitaxial etch-stop layers. The current method is stable over the commonly used range of temperatures and uses widely available standard etch chemistries and conditions. The prior art makes use of either Al-containing etch-stop layers, which cannot be etched selectively with respect to AlN or higher Al fraction $Al_xGa_{1-x}N$ (see Buttari, supra; Lee, supra; and Pearton, supra), or In-containing etch-stop layer, which only function for low temperatures and low etch powers. See Pearton, supra. In addition, $Sc_xAl_{1-x}N$ etch-stop layers can be grown lattice-matched to GaN for $x \approx 0.2$, see Moram 2014, supra, which avoids etch-stop layer thickness constraints and greatly simplifies integration of ScAlN with GaN-based devices. InGaN and AlGaN etch-stop layer cannot be lattice-matched to GaN. Additionally, the etch-stop can also contain a low alloy fraction of Sc, allowing for the ScAlN film to be grown sufficiently thick on AlN.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A semiconductor device structure, comprising:
    a substrate;
    an epitaxial overlying III-nitride semiconductor material device layer; and
    an epitaxial etch-stop layer disposed between the substrate and the overlying III-nitride semiconductor material device layer;
    wherein the overlying III-nitride semiconductor material device layer is formed directly on an upper surface of the etch-stop layer;
    wherein the etch-stop layer is epitaxial ScAlN, ScGaN, ScAlGaN, ScN, ScInN, YAlN, YGaN, YN, YInN, or YAlGaN or a quaternary alloy thereof and forms an etch stop for a dry etching of the overlying III-nitride semiconductor material device layer; and
    wherein at least a portion of the etch-stop layer remains in the structure after a predetermined controlled dry etching of at least a portion of the overlying III-nitride semiconductor material device layer.

2. The semiconductor device structure according to claim 1, wherein the epitaxial etch-stop layer comprises a polycrystalline material layer.

3. The semiconductor device structure according to claim 1, wherein the epitaxial overlying III-nitride semiconductor material device layer comprises single-crystal AlN, GaN, AlGaN, InN, or a ternary or quaternary alloy thereof.

4. The semiconductor device structure according to claim 1, wherein the substrate comprises AlN, GaN, SiC, Si or sapphire.

5. The semiconductor device structure according to claim 1, wherein the substrate, the epitaxial overlying III-nitride semiconductor material device layer, and the epitaxial etch-stop layer have a single-crystal structure.

6. The semiconductor device structure according to claim 1, further comprising an intermediate epitaxial material layer disposed between the substrate and the epitaxial etch-stop layer.

7. A semiconductor device structure, comprising:
    a carrier layer;
    an epitaxial III-nitride semiconductor material device layer disposed on the carrier layer;
    an epitaxial etch-stop layer disposed directly adjacent the epitaxial III-nitride semiconductor material device layer; and
    an intermediate epitaxial material layer disposed directly adjacent the epitaxial etch-stop layer;
    wherein the epitaxial etch-stop layer is epitaxial SLAlN, ScGaN, ScAlGaN, ScN, ScInN, YAlN, YGaN, YN, YInN, or YAlGaN or a quaternary alloy thereof and forms an etch stop for a dry etching of the intermediate epitaxial layer; and
    wherein at least a portion of the etch-stop layer remains in the structure after a predetermined controlled dry etching of at least a portion of the intermediate epitaxial material layer.

8. The semiconductor device structure according to claim 7, wherein the epitaxial etch-stop layer comprises a polycrystalline material layer.

9. The semiconductor device structure according to claim 7, wherein the epitaxial III-nitride semiconductor material device layer comprises single-crystal AlN, GaN, AlGaN, InN, or a ternary or quaternary alloy thereof.

10. The semiconductor device structure according to claim 7, wherein the carrier layer, the epitaxial III-nitride semiconductor material device layer, the intermediate epitaxial material layer, and the epitaxial etch-stop layer have a single-crystal structure.

* * * * *